United States Patent
Huang et al.

(10) Patent No.: US 9,602,086 B2
(45) Date of Patent: Mar. 21, 2017

(54) DOUBLE HALF LATCH FOR CLOCK GATING

(71) Applicant: Oracle International Corporation, Redwood City, CA (US)

(72) Inventors: He Huang, San Jose, CA (US); Mayur Joshi, San Carlos, CA (US); Ha Pham, San Jose, CA (US); Jin-Uk Shin, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 134 days.

(21) Appl. No.: 14/667,721

(22) Filed: Mar. 25, 2015

(65) Prior Publication Data

US 2016/0285440 A1 Sep. 29, 2016

(51) Int. Cl.
*H03K 5/13* (2014.01)
*H03K 3/356* (2006.01)
*H03K 3/037* (2006.01)
*G06F 1/06* (2006.01)
*G06F 1/10* (2006.01)
*G06F 1/04* (2006.01)
*H03K 19/00* (2006.01)

(52) U.S. Cl.
CPC ....... *H03K 3/356104* (2013.01); *H03K 3/037* (2013.01); *G06F 1/04* (2013.01); *G06F 1/06* (2013.01); *G06F 1/10* (2013.01); *H03K 5/13* (2013.01); *H03K 19/0016* (2013.01)

(58) Field of Classification Search
None
See application file for complete search history.

(56) References Cited

U.S. PATENT DOCUMENTS

| | | | | |
|---|---|---|---|---|
| 5,883,529 A | * | 3/1999 | Kumata | G06F 1/06 326/83 |
| 6,573,754 B2 | * | 6/2003 | Menczigar | H03K 19/0016 326/56 |
| 9,270,270 B2 | * | 2/2016 | Cai | H03K 3/356052 |

(Continued)

OTHER PUBLICATIONS

Saint-Laurent et al., "A 28nm DSP Powered by an On-Chip LDO for High-Performance and Energy-Efficient Mobile Applications", IEEE International Solid-State Circuits Conference, Session 10, Feb. 11, 2014, 3 pages.

(Continued)

*Primary Examiner* — Tuan T Lam
(74) *Attorney, Agent, or Firm* — Meyertons, Hood, Kivlin, Kowert & Goetzel, P.C.; Erik A. Heter

(57) ABSTRACT

A double half latch circuit includes a first stage coupled to receive a local input enable signal on an input of a second logic gate, and a complement of the clock signal on an input of a third logic gate, and further includes a fourth logic gate coupled to generate an intermediate enable signal based on states of the local input enable signal the complement of the clock signal. A second stage includes a fifth logic gate coupled to receive the complement of the clock signal, and a sixth logic gate coupled to receive the intermediate enable signal, and is configured to generate the output enable signal. The double half-latch circuit is transparent to the state changes of the local input enable signal when the clock signal is low and opaque to state changes of the local input enable signal when the clock signal is high.

19 Claims, 4 Drawing Sheets

(56) References Cited

U.S. PATENT DOCUMENTS

| | | | | |
|---|---|---|---|---|
| 9,291,674 B1* | 3/2016 | Lu | ............... | G01R 31/3177 |
| 2003/0169841 A1* | 9/2003 | van der Valk | ....... | H03K 23/665 |
| | | | | 377/115 |
| 2006/0132185 A1* | 6/2006 | Ham | .............. | G06F 1/10 |
| | | | | 326/93 |
| 2014/0266396 A1* | 9/2014 | Berzins | .............. | H03K 3/356 |
| | | | | 327/399 |
| 2014/0292372 A1* | 10/2014 | Gururajarao | ....... | H03K 19/0013 |
| | | | | 326/95 |
| 2015/0316950 A1* | 11/2015 | Dey | .............. | H03K 19/20 |
| | | | | 327/291 |
| 2016/0004273 A1* | 1/2016 | Chiang | .............. | G06F 1/08 |
| | | | | 713/501 |
| 2016/0061889 A1* | 3/2016 | Bawa | .............. | G01R 31/318552 |
| | | | | 714/729 |

OTHER PUBLICATIONS

D. Dobberpuhl, R. Witek et al. "A 200-MHz 64-b Dual-issue CMOS processor", IEEE Journal of Solid State Circuit, vol. 27, No. 11, Nov. 1992, pp. 1555-1565.

* cited by examiner

DOUBLE HALF LATCH FOR CLOCK GATING

BACKGROUND

1. Technical Field

This disclosure relates to integrated circuits, and more particularly, to clock gating in integrated circuits.

2. Description of the Related Art

Clock gating is a technique often used in integrated circuit (IC's) to achieve dynamic power savings. As some clock functional circuits may at times become idle during operation of an IC, power savings can be achieved by inhibiting the clock signal from being provided thereto. As such, dynamic power savings can be achieved, as the overall amount of switching is reduced in the IC when some circuits are not receiving a clock signal.

A wide variety of clock gating circuits are implemented in IC's today. Typical clock gating circuits include logic circuitry coupled to receive an enable signal and the clock signal (e.g., an AND gate), and circuitry for generating the enable signal. The circuitry for generating the enable signal may, for example, prevent the enable signal from changing states when the clock signal is in its active (e.g., high) state, which could adversely affect downstream functional circuitry. The enable generating circuitry for such clock gating circuits receives both the clock signal and its complement, and may also receive one or more high level enable signals. Such enable generating circuitry may ensure that the enable signal provided to the logic gate switched only when the clock signal is in its inactive (e.g., low) state.

SUMMARY OF THE DISCLOSURE

A double-half latch clock gating circuit is disclosed. In one embodiment, the circuit includes a first logic gate coupled to receive a clock signal and an output enable signal and a double half latch circuit. The double half latch includes a first latch stage coupled to receive a local input enable signal on an input of a second logic gate, and a complement of the clock signal on an input of a third logic gate, and further includes a fourth logic gate coupled to generate an intermediate enable signal based on states of the local input enable signal the complement of the clock signal. A second latch stage includes a fifth logic gate coupled to receive the complement of the clock signal, and a sixth logic gate coupled to receive the intermediate enable signal and an output of the fifth logic gate, the second latch stage being configured to generate the output enable signal. The double half-latch circuit is configured to be transparent to the state changes of the local input enable signal when the clock signal is low, and further configured to be opaque to state changes of the local input enable signal when the clock signal is high.

The double half latch circuit is configured operate based on receiving only one phase of the clock signal, e.g., the complement of the clock signal. This is in contrast to embodiments in which both a true and complementary clock signal are received in a latch circuit used to generate an output enable signal.

BRIEF DESCRIPTION OF THE DRAWINGS

Other aspects of the disclosure will become apparent upon reading the following detailed description and upon reference to the accompanying drawings which are now described as follows.

Figure 1:
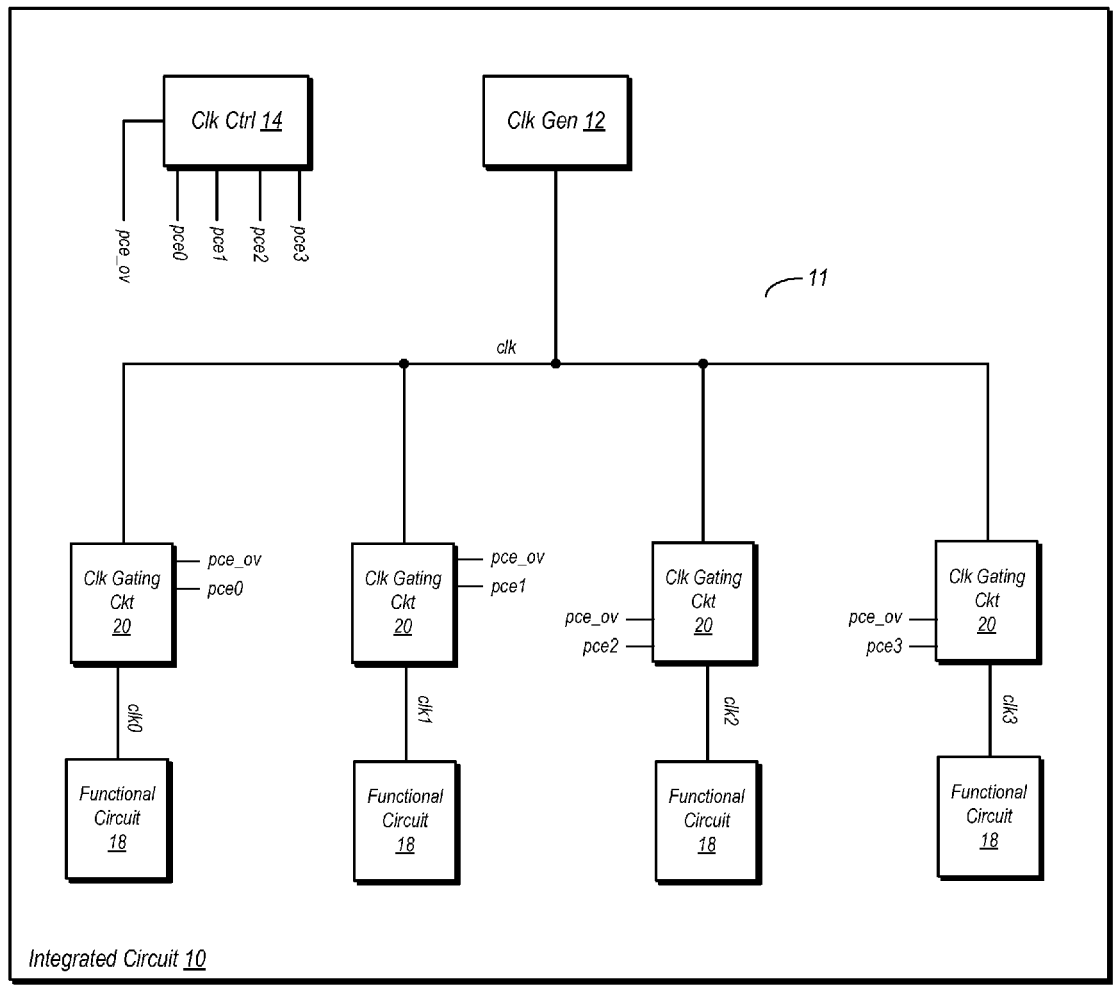
FIG. 1 is a block diagram of an embodiment of an IC having a clock tree.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION

Turning now to FIG. 1, a block diagram of one embodiment of an integrated circuit (IC) having a clock tree is shown. It is noted that the embodiment of IC 10 shown in FIG. 1 is simplified for the sake of illustration, but is not intended to be limiting.

In the embodiment shown, IC 10 includes a plurality of functional circuits 18 that perform various intended functions of IC 10. Each of the functional circuits 18 is coupled to receive a corresponding clock signal. A clock generation circuit 12 is configured to distribute a clock signal via a clock tree, to each of a number of clock gating circuits 20. Each of the clock gating circuits is coupled to output a corresponding clock signal to a respectively coupled functional circuit 18.

The clock gating circuit 20 in the embodiment shown are each configured to selectively enable the respective clock signal to be provided to its correspondingly coupled functional circuit 18, or may inhibit it from being provided thereto. For a respective clock gating circuit 20, the clock signal may be provided to its correspondingly coupled functional circuit 18, it may receive one of two enable signal. Each of the clock gating circuits 20 is coupled to receive a local enable signal, e.g., pce0 for first clock gating circuit 20, pce1 for a second clock gating circuit 20, and so on. If a local enable signal provided to a given clock gating circuit 20 is asserted, the clock signal is provided to the correspondingly coupled functional circuit 18. Each of the clock gating circuits 20 is also coupled to receive a global enable signal, pce_ov. Then the global enable signal is asserted, each of the clock gating circuits 20 is configured to provide a clock signal to its respectively coupled functional circuit. For any one of the clock gating circuits 20, if neither its local enable signal nor the global enable signal is asserted, then its corresponding clock signal is inhibited from being provided to its respectively coupled functional circuit 18.

In the embodiment shown, IC 10 includes a clock control unit 14. The clock control unit 14 may control the local enable signals provided to each of the clock gating circuits, as well as controlling the global enable signal that is provided to all. In some embodiments, clock gating circuit 14 may be part of a larger power management circuit that may selectively enable or disable the clock gating circuits 20 to control power consumption or thermal output of IC 10.

Figure 2A:
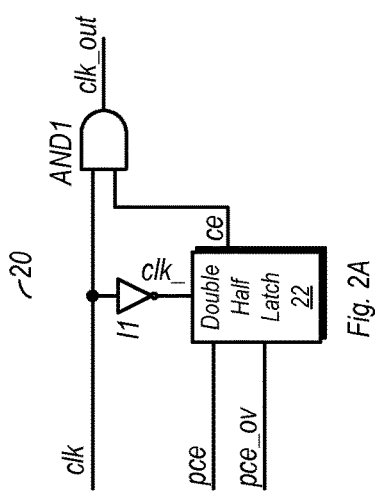
FIG. 2A is a logic diagram of one embodiment of a clock gating circuit.

FIG. 2A is a logic diagram of one embodiment of a clock gating circuit 20. In the embodiment shown, clock gating circuit includes a two-input AND gate, AND1, an inverter I1, and a double half latch circuit 22. AND1 is coupled to receive the clock signal on one input and the clock enable signal from the double half latch circuit 22 on its other input. The double half latch circuit is configured to receive a complement of the clock signal, clk_, via inverter I1, along with a local input enable signal, pce, and a global input enable signal, pce_ov. The local input enable signal is unique to the particular instance of clock gating circuit 20 shown in FIG. 2A. The global input enable signal may be provided to a number of different clock gating circuits.

Double half latch circuit 22 in the embodiment shown is configured to be transparent to state changes of the input enable signals when the clock signal is low (and thus clk_ is high). When the clock signal is high (and thus, clk_ is low), double half latch circuit is configured to be opaque to changing states of the input enable signals.

To enable an individual instance of clock gating circuit 20 to pass the clock signal from clk to clk_out, the output enable signal, ce, is asserted. Thereafter, the output of AND1 follows the clock signal. As noted the double half latch is transparent when the clock signal is low (clk_ high) and opaque when the clock signal is high (clk_ low). Assuming the global input enable signal, pce_ov, is de-asserted, assertion of the local input enable signal when the clock signal is low (clk_ high) results in assertion of the output enable signal, ce. If the global input enable signal is asserted while the clock signal is high (clk_ low), the output enable signal remains de-asserted. However, if the local input enable signal remains asserted until after the clock signal falls low (clk_ goes high), then the output enable signal will be asserted responsive to the change of state of the clock signal. If the state of the local input enable signal changes from asserted to de-asserted while the clock signal is high (clk_ low), the output enable signal will remain asserted. If the local enable signal remains de-asserted when the clock falls low (clk_ goes high), or become de-asserted when the clock signal is low, the output enable signal changes states from asserted to de-asserted.

The operation of this embodiment of double half latch 22 responsive to changes to the global input enable signal, pce_ov, is similar to that described above with respect to the local input enable signal, pce. When the local enable signal is de-asserted, the double half latch 22 in this embodiment is transparent to state changes of the global input enable signal when the clock signal is low (clk_ high) and opaque when the clock signal is high (clk_ low).

Figure 2B:
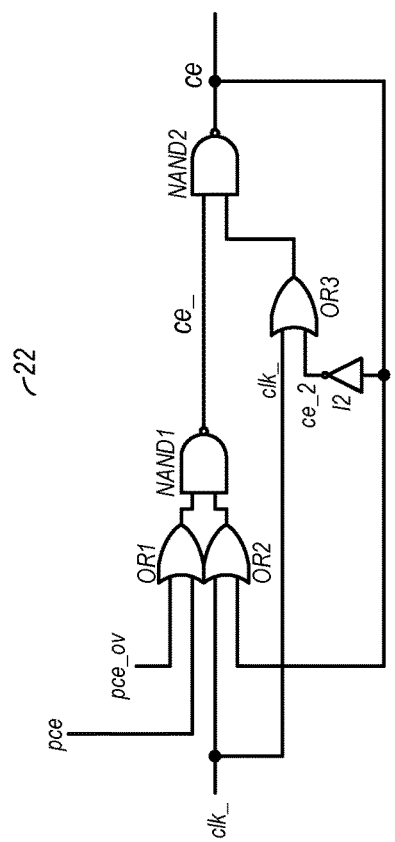
FIG. 2B is a logic diagram illustrating one embodiment of a double half latch circuit used in a clock gating circuit.

FIG. 2B is a logic diagram illustrating one embodiment of a double half latch circuit 22. In the embodiment shown, double half latch circuit 22 is configured to receive three different input signals: a local input enable signal, pce, a global input enable signal, pce_ov, and a complement of the clock signal, clk_. Double half latch circuit 22 is configured to generate an output enable signal, ce.

Double half latch 22 in the embodiment shown may be divided into two stages. The first stage includes OR gates OR1 and OR2 and NAND gate NAND1. The first stage is configured to generate an intermediate enable signal ce_. The second stage of double half latch 22 includes a second NAND gate, NAND2, along with a third OR gate, OR3, and inverter I2. The second stage of double half latch 22 is configured to generate the output enable signal based on states of the intermediate enable signal, the complement of the clock signal, and another complement of the output enable signal, ce_2.

OR1 in the embodiment shown is configured to provide a logic 1 to a first input of NAND1 when either one (or both) of the input enable signals, pce and pce_ov, are logic 1's. OR2 may provide a logic 1 to the other input of NAND1 when either the complementary clock signal (clk_) is high or the output of double half latch 22 is a logic 1. When both inputs to NAND1 are logic 1's, the intermediate enable signal, ce_, is a logic 0 (or low in this case). When the intermediate enable signal is a logic 0, the output of double half latch 22 is a logic 1.

If the output of OR1 changes from a logic 1 to a logic 0 when the complementary clock signal is low (and thus, the clock is high), the logic 1 output from NAND2 may nevertheless be held at least until the clock signal transitions states again. Even though NAND1 will output a logic 1 when both OR1 outputs a logic 0, OR3 will output a logic 0. This is due to the fact that clk_ is low (or logic 0), and the complement of the output signal, ce_2 is also a logic 0 due to the logic 1 of the output enable signal, ce. However, when complementary clock signal transitions to a high state (assuming the output of OR1 remains a logic 0), NAND2 will change the state of the output enable signal from a logic 1 to a logic 0 due to having logic 1's on both of its inputs.

If the output of OR1 changes from a logic 0 to a logic 1 when the complementary clock signal is low and the output enable signal is also a logic 0, the output of NAND1 may initially remain as a logic 1. OR3 also outputs a logic 1 at this time due to the complement of the output signal, ce_2, being a logic 1 (by virtue of the logic 0 on ce).

Thus the output enable signal remains low. Assuming the output of OR1 remains a logic 1 as the complementary clock signal transitions from low to high, the output of NAND1 which change from a logic 1 to a logic 0, since the outputs of both OR1 and OR2 will be logic 1's after the transition of the complementary clock signal from low to high. Accordingly, the intermediate enable signal, ce_, falls to a logic 0, thereby causing NAND2 to cause the output enable signal to transition from a logic 0 to a logic 1.

Generally speaking, double half latch 22 in the embodiment shown blocks transitions of the output enable signal when the complementary clock signal is low, and allows transitions to occur when the complementary clock signal is high. When the complementary clock signal is high, the output enable signal will be the same as the output of OR1, which receives both the local and global input enable signals. When the complementary clock signal is low, the output enable signal will correspond to the logic value output from OR1 when the complementary clock signal transitions from high to low. This state will be held at least the next time that the complementary clock signal is high concurrent with one of the input enable signal being asserted as a logic 1.

Figure 3:
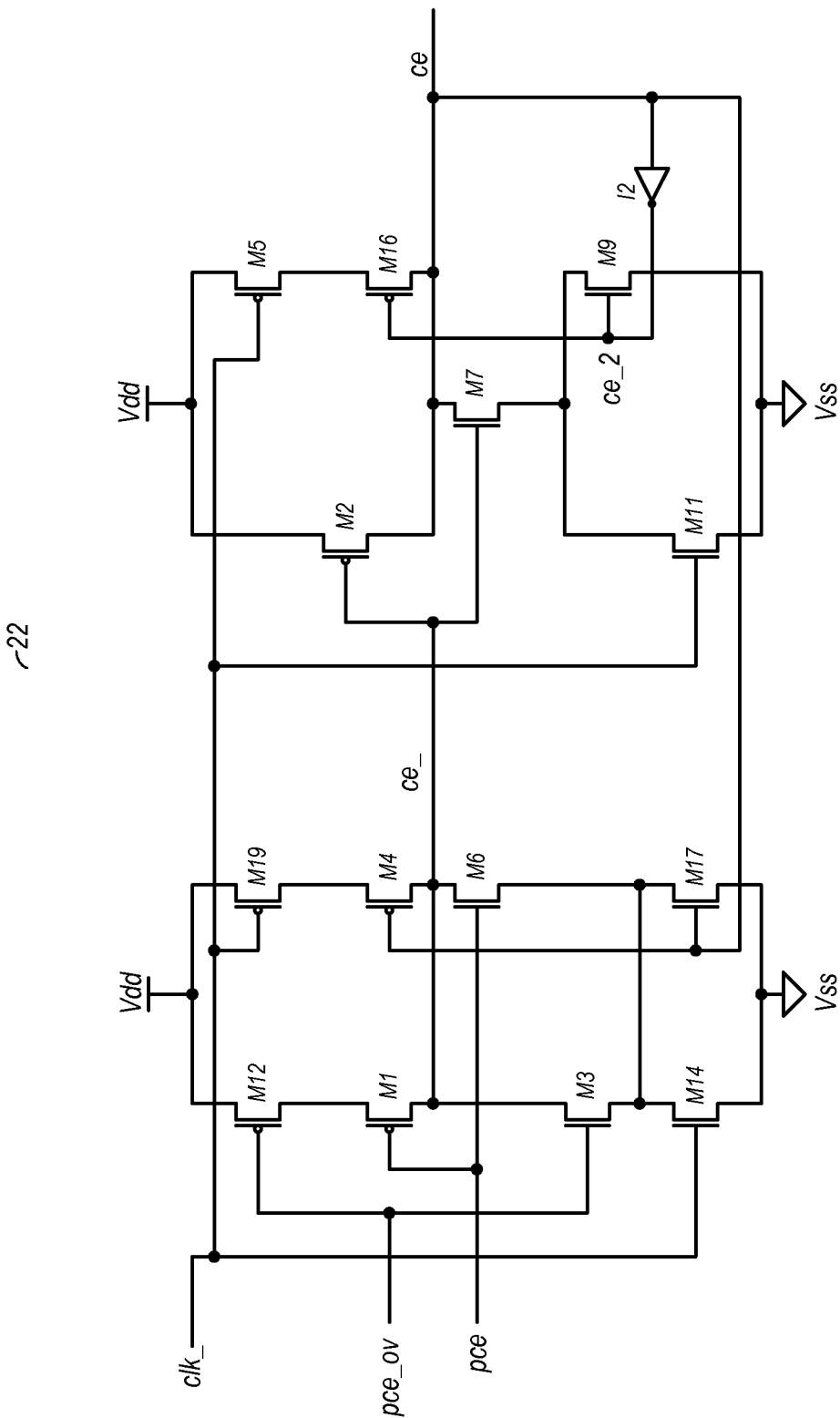
FIG. 3 is a schematic diagram illustrating a transistor level implementation of one embodiment of a double half latch circuit.

Turning now to FIG. 3, a schematic diagram illustrating a transistor level implementation of one embodiment of double half latch circuit 22 is shown. In the embodiment shown, transistors M1, M3, M4, M6, M12, M14, M17, and M19, collectively, implement the two OR gates (OR1 and OR2) and the first NAND gate (NAND1) of the logic diagram shown in FIG. 2B. Transistors M2, M5, M7, M9, M11, and M16 implement the third OR gate (OR3) and the second NAND gate (NAND2).

When both pce and pce_ov are logic lows, transistors M1 and M12 are active, providing a pull-up path between ce_ and Vdd. If pce is high, transistor M6 is active, which transistor M3 is active if pce_ov is high. If clk_ is high, ce_ may be pulled low through M6 and M14 (if pce is high) or through M3 and M14 (if pce_ov is high), or through both of these pull-down paths (if pce and pce_ov are both high). When ce_ is pulled low, M2 is activated, and ce is pulled up toward Vdd.

A second pull-up path exists to pull ce_ high, through M4 and M19. M19 may be activated when clk_ is low, while M4 is active when ce is low. Once activated, this pull-up path may remain active until clk_ transitions high, even if pce or pce_ov also transition high.

Another pull-down path for ce_ may be provided through M17, which may be activated when ce is high. If either M3 or M6 are active, ce_ may be pulled low through this pull-down path even if clk_ is low.

A second pull-up path for ce may be provided through M5 and M16. When clk_ is low, M5 is active, while M16 is active when ce is high, which causes ce_2 (output from I2) to be low. Thus, this circuit may function as a keeper to keep ce high when clk_ is low, even if one or both pce and pce_ov fall low at this time.

When ce_ is low, transistor M7 is active. A pull-down path between ce and Vss may be provided if M11 is also active (responsive to clk_ being high), or if M9 is active (responsive to ce being low and thus ce_2 being high).

Figure 4:
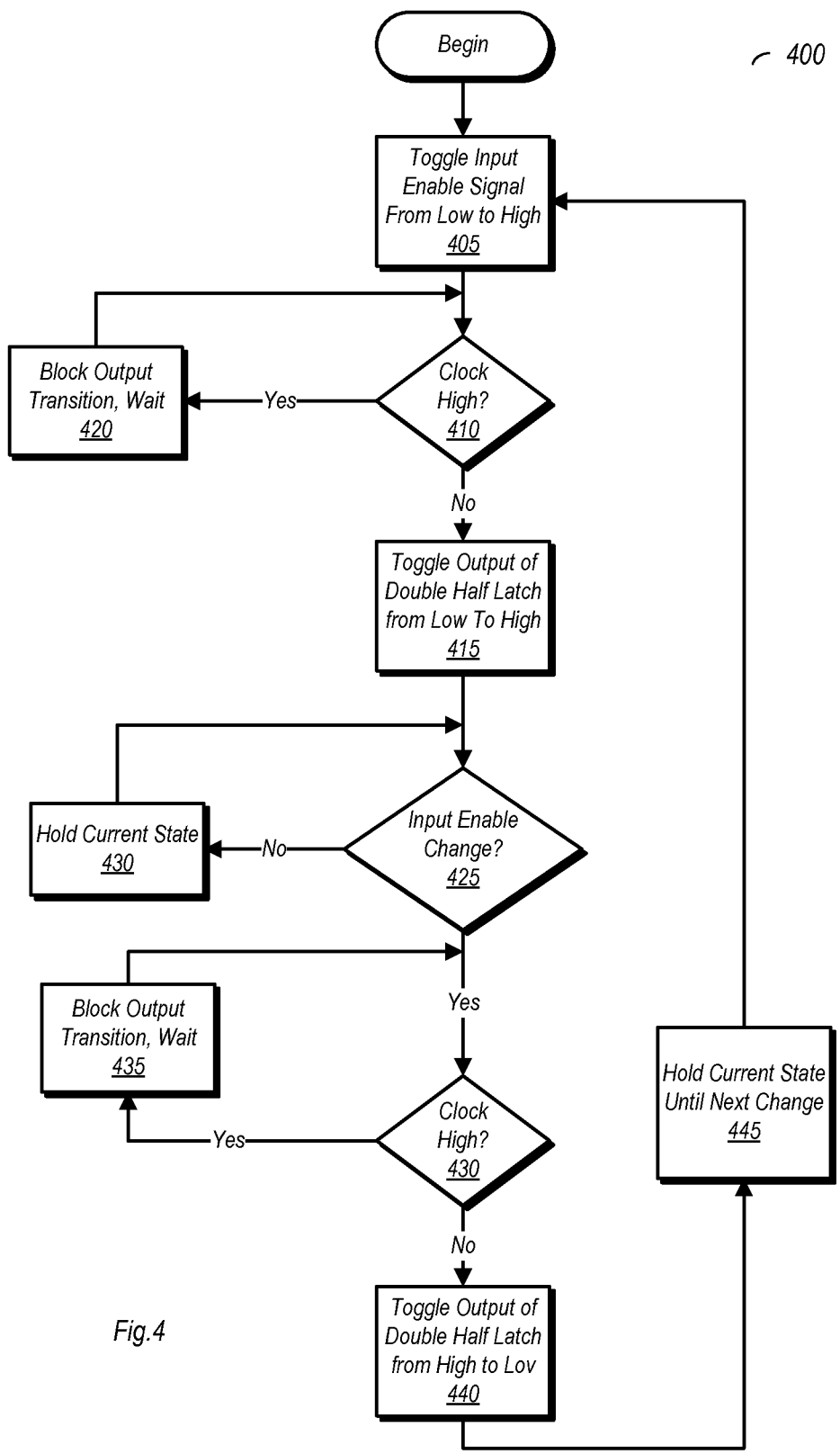
FIG. 4 is flow diagram illustrating one embodiment of a method for operating a double half latch circuit.

FIG. 4 is flow diagram illustrating one embodiment of a method for operating a double half latch circuit. Method 400 may be performed using various embodiments of the double half latch circuit 22 discussed above. It is noted that method 400 does not necessarily describe every possible operational scenario of a double half latch circuit according to the disclosure, but is instead provide here to give a general idea of its functionality. Furthermore, the logic levels here (low and high) are exemplary, but are not intended to limit the disclosure to operation using these particular levels as shown in the diagram).

Method 400 begins with the toggling of an enable signal from low to high (block 405). If the clock is high (block 410, yes), the output transition is blocked, and the circuit is in a wait state (block 420). However, if the clock signal is low, or once the clock signal falls low (block 410, no), the output of the double half latch is toggled from low to high (block 415). If the input enable signal does not change states again at this point, (block 425), the current state of the output is held (block 430).

Eventually, the input enable signal changes states again, e.g., from high to low in this example (block 425, yes). If the clock is high when this change occurs (block 430, yes), the output transition is blocked by the circuit (block 435). Once the clock is no longer high (block 430, no), then the output of the double half latch is changed from high to low (block 440). Thereafter, the current output state is held at least until the next change of the input enable signal (block 445), and the method returns to block 405.

Numerous variations and modifications will become apparent to those skilled in the art once the above disclosure is fully appreciated. It is intended that the following claims be interpreted to embrace all such variations and modifications.

What is claimed is:

1. A circuit comprising:
a first logic gate coupled to receive a clock signal and an output enable signal;
a double half latch circuit including:
a first latch stage coupled to receive a local input enable signal on an input of a second logic gate, and a complement of the clock signal on an input of a third logic gate, wherein the first latch stage further includes a fourth logic gate coupled to generate an intermediate enable signal based on states of the local input enable signal and the complement of the clock signal; and
a second latch stage including a fifth logic gate coupled to receive the complement of the clock signal, and a sixth logic gate coupled to receive the intermediate enable signal and an output of the fifth logic gate, the second latch stage being configured to generate the output enable signal;
wherein the double half-latch circuit is configured to be transparent to the state changes of the local input enable signal when the clock signal is low, and further configured to be opaque to state changes of the local input enable signal when the clock signal is high.

2. The circuit as recited in claim 1, wherein the second and third logic gates are OR gates, wherein the second logic gate is coupled to receive the local input enable signal and a global input enable signal, and wherein the third logic gate is coupled to receive the complement of the clock signal and the output enable signal.

3. The circuit as recited in claim 2, wherein the fourth logic gate is a NAND gate, wherein the NAND gate is configured to drive the intermediate enable signal low responsive to at least one of the local and global input enable signals being high and at least one of the complement of the clock signal and the output enable signal being high.

4. The circuit as recited in claim 1, wherein the fifth logic gate is an OR gate coupled to receive the complement of the clock signal and a complement of the output enable signal.

5. The circuit as recited in claim 4, wherein the sixth logic gate is a NAND gate configured to drive the output enable signal low when the intermediate enable signal is high and one of the complement of the clock signal or one of the complement of the output enable signal is high.

6. The circuit as recited in claim 5, wherein the NAND gate is configured to drive the output enable signal high when either the intermediate enable signal is low or an output of the fifth logic gate is low.

7. The circuit as recited in claim 1, wherein the double half latch circuit includes logic circuitry coupled to receive the complement of the clock signal and includes no logic circuitry coupled to receive the clock signal at its true value.

8. The circuit as recited in claim 1, wherein the double half latch circuit is further configured to receive a global input enable signal, wherein the double half latch circuit is configured to be transparent to changes of the state of the global input enable signal, irrespective of a state of the local input enable signal, when the complement of the clock signal is high.

9. The circuit as recited in claim 8, wherein the double half latch circuit is configured to be opaque to changes of either of the local or global input enable signals when the complement of the clock signal is low.

10. A method comprising:
providing a true clock signal and an output enable signal to a first logic circuit;
receiving, at a double half latch circuit, a local input enable signal and a complementary clock signal that is a complement of the true clock signal, wherein the true clock signal is not provided to the double half latch circuit;
generating, using a first stage of the double half latch circuit, a state of an intermediate enable signal based on respective states of the complementary clock signal and the local input enable signal;
generating the output enable signal, using a second stage of the double half latch circuit, based on respective states of the intermediate enable signal and the complementary clock signal;
changing a state of the output enable signal based on a change of the local input enable signal when the complementary clock signal is high;
inhibiting a change of state of the output enable signal when the complementary clock signal is low;
receiving a global input enable signal at the double half latch circuit; and
asserting the output enable signal when the global input enable signal is asserted and the complementary clock signal is high irrespective of a state of the local input enable signal.

11. The method as recited in claim 10, further comprising asserting the output enable signal when the local input enable signal is asserted and the complementary clock signal is high.

12. The method as recited in claim 10, further comprising:
activating the intermediate enable signal responsive to assertion of one of the local input enable or global input enable signals and when either the complementary clock signal is high or the output enable signal is asserted.

13. The method as recited in claim 12, further comprising:
asserting the output enable signal responsive to activation of the intermediate enable signal.

14. An integrated circuit comprising:
a plurality of functional circuits;
a clock distribution network, wherein the clock distribution network is configured to distribute a clock signal to each of a plurality of clock gating circuits, wherein each of the plurality of clock gating circuits is coupled to a corresponding one of the plurality of functional circuits, wherein each of the plurality of clock gating circuit includes:
an AND gate coupled to receive the clock signal and an output enable signal;
a double half latch circuit configured to provide the output enable signal, the double half latch circuit including:
a first latch stage coupled to receive a local input enable signal at an input of a first OR gate, and a complement of the clock signal on an input of a second OR gate, wherein the first latch stage further includes a first NAND gate configured to generate an intermediate enable signal based on respective states of the complement of the clock signal and local input enable signal; and
a second latch stage having a second NAND gate coupled to receive the intermediate enable signal and an output of a third OR gate;
wherein the double half-latch circuit is configured to be transparent to the state changes of its respectively received local input enable signal when the clock signal is low, and further configured to be opaque to state changes of the local input enable signal when the clock signal is high.

15. The integrated circuit as recited in claim 14, wherein the first OR gate is further coupled to receive a global input enable signal, and wherein the second OR gate is further coupled to receive the output enable signal.

16. The integrated circuit as recited in claim 15, wherein the first NAND gate is configured to drive the intermediate enable signal low responsive to assertion of the local enable signal or the global enable signal and the complement of the clock signal or the output enable signal being high.

17. The integrated circuit as recited in claim 14, wherein the second NAND gate is configured to assert the output enable signal responsive to either the intermediate enable signal being low or an output of the third OR gate being low.

18. The integrated circuit as recited in claim 17, wherein the second NAND gate is configured to de-assert the output enable signal responsive to the intermediate enable signal and output of the third OR gate both being high.

19. The integrated circuit as recited in claim 14, wherein the double half latch circuit includes an input for the complement of the clock signal but does not include an input for the clock signal.

* * * * *

UNITED STATES PATENT AND TRADEMARK OFFICE
CERTIFICATE OF CORRECTION

PATENT NO. : 9,602,086 B2
APPLICATION NO. : 14/667721
DATED : March 21, 2017
INVENTOR(S) : Huang et al.

It is certified that error appears in the above-identified patent and that said Letters Patent is hereby corrected as shown below:

In the Drawings

On sheet 4 of 4, in Fig. 4, under Reference Numeral 440, Line 3, delete "Lov" and insert -- Low --, therefor.

In the Specification

In Column 4, Lines 54-62, delete "Thus the output enable signal remains low. Assuming the output of OR1 remains a logic 1 as the complementary clock signal transitions from low to high, the output of NAND1 which change from a logic 1 to a logic 0, since the outputs of both OR1 and OR2 will be logic 1's after the transition of the complementary clock signal from low to high. Accordingly, the intermediate enable signal, ce_, falls to a logic 0, thereby causing NAND2 to cause the output enable signal to transition from a logic 0 to a logic 1." and insert the same on Column 4, Line 53, as a continuation of the same paragraph.

Signed and Sealed this
Third Day of October, 2017

Joseph Matal
*Performing the Functions and Duties of the*
*Under Secretary of Commerce for Intellectual Property and*
*Director of the United States Patent and Trademark Office*